US009967998B1

(12) United States Patent
Kim et al.

(10) Patent No.: US 9,967,998 B1
(45) Date of Patent: May 8, 2018

(54) SERVER RACK ARCHITECTURE THAT FACILITATES REDUCED CURRENT DENSITY

(71) Applicant: Google LLC, Mountain View, CA (US)

(72) Inventors: Sangsun Kim, San Jose, CA (US); Honggang Sheng, Milpitas, CA (US); Ken Krieger, Jackson, WY (US)

(73) Assignee: Google LLC, Mountain View, CA (US)

( * ) Notice: Subject to any disclaimer, the term of this patent is extended or adjusted under 35 U.S.C. 154(b) by 10 days.

(21) Appl. No.: 15/179,390

(22) Filed: Jun. 10, 2016

Related U.S. Application Data

(62) Division of application No. 13/798,759, filed on Mar. 13, 2013, now Pat. No. 9,392,720.

(51) Int. Cl.
*G06F 1/16* (2006.01)
*H05K 5/00* (2006.01)
*H05K 7/00* (2006.01)
*H05K 7/14* (2006.01)

(52) U.S. Cl.
CPC ................... *H05K 7/1492* (2013.01)

(58) Field of Classification Search
CPC .. H05K 7/1492; H05K 7/1488; H05K 7/1487; H05K 7/1485
USPC ...................... 361/724–727; 312/223.1–223.3
See application file for complete search history.

(56) References Cited

U.S. PATENT DOCUMENTS

| | | | |
|---|---|---|---|
| 6,796,833 B2 | 9/2004 | Baker | |
| 7,278,273 B1 | 10/2007 | Whitted et al. | |
| 7,386,743 B2 | 6/2008 | Bahali et al. | |
| 7,633,181 B2 | 12/2009 | Gross et al. | |
| 7,719,823 B2 * | 5/2010 | Josten | H02B 1/14 174/129 B |
| 9,072,191 B2 * | 6/2015 | Silberbauer | H05K 7/1432 |
| 2003/0112582 A1 * | 6/2003 | Sanders | H05K 7/1492 361/600 |
| 2005/0286235 A1 * | 12/2005 | Randall | H05K 7/1492 361/724 |
| 2008/0007909 A1 * | 1/2008 | Merkin | G06F 1/206 361/601 |
| 2008/0030962 A1 * | 2/2008 | Kunkle | G06F 1/186 361/726 |
| 2010/0100756 A1 | 4/2010 | Rahardjo | |

(Continued)

OTHER PUBLICATIONS

Sarti, P., "Open Compute Project: Battery Cabinet," Apr. 7, 2011, Hardware V1 .0, 13 pages.

(Continued)

*Primary Examiner* — Anthony Haughton
(74) *Attorney, Agent, or Firm* — Fish & Richardson P.C.

(57) ABSTRACT

A server rack with vertically stacked shelves is disclosed. The shelves are used for housing loads (e.g. servers) and power supply units. Thus, both the power supply units and the servers are vertically stacked in the rack. An array of vertical and horizontal busses is secured to the back side of the server rack to electrically couple the servers with the power supply units. The arrangement of the PSUs and the busses provides for uniform current density across the server rack. The devices placed on the shelves are accessible and serviceable from the front of the server rack. The server rack can be placed within or secured to a device, system or a server room in a vertical orientation, a horizontal orientation or at an angle.

13 Claims, 11 Drawing Sheets

(56) References Cited

U.S. PATENT DOCUMENTS

2010/0314166 A1* 12/2010 Malkowski, Jr. ........ H02B 1/21
174/72 B
2011/0133560 A1 6/2011 Yamashita et al.
2011/0304211 A1 12/2011 Peterson et al.
2012/0000975 A1 1/2012 Heath et al.

OTHER PUBLICATIONS

Furuta, S., "Open Compute Project: Server Chassis and Triplet" Apr. 7, 2011, Hardware V1 .0, 10 pages.

Metz, C., "Mystery Men Forge Servers for Giants of Internet," Wired Enterprise, Wired.com, Dec. 19, 2011, http://www.wired.com/wiredenterprise/2011/12/secret-servers/all/1, Last accessed Mar. 26, 2013, 9 pages.

Metz, C., "Welcome to Prineville, Oregon: Population, 800 Million," Wired Enterprise, Wired.com, Dec. 1, 2011, http://www.wired.com/wiredenterprise/2011/12/facebook-data-center/all/1, Last accessed Mar. 26, 2013, 14 pages.

* cited by examiner

SERVER RACK ARCHITECTURE THAT FACILITATES REDUCED CURRENT DENSITY

CROSS-REFERENCE TO RELATED APPLICATIONS

This application is a divisional application of, and claims priority to, U.S. patent application Ser. No. 13/798,759, titled "Server Rack Architecture That Facilitates Reduced Current Density," filed on Mar. 13, 2013. The disclosure of the foregoing application is incorporated herein by reference in its entirety for all purposes.

TECHNICAL FIELD

The subject disclosure relates to server racks and more particularly to optimizing current distribution by reducing current density within a server rack.

BACKGROUND

Server racks are used to house multiple computer servers and other related loads, and to provide power and communication signals to them. A server rack uses busses to distribute the current generated by power supply units (PSUs) to the loads situated on various shelves of the server rack. In conventional server rack architecture, the PSUs are located on either the top shelf or the bottom shelf of the server rack, and the current generated by them is distributed to the various loads by using a vertical bus. The vertical bus location closest to the PSUs is subjected to maximum current density. The current density progressively decreases at vertical bus locations away from the PSUs. Conventional server rack architecture requires oversized busses that can support the maximum possible current density that can be generated by the PSUs. Oversized busses are undesirable because they require more space and increased material costs than smaller busses.

SUMMARY

The following presents a simplified summary of the specification in order to provide a basic understanding of some aspects of the specification. This summary is not an extensive overview of the specification. It is intended to neither identify key or critical elements of the specification nor delineate any scope of particular aspects of the specification, or any scope of the claims. Its sole purpose is to present some concepts of the specification in a simplified form as a prelude to the more detailed description that is presented later.

According to an implementation of the subject disclosure, a server rack having vertically stacked shelves and vertically stacked PSUs is disclosed. Two vertical busses are secured to the back side of the server rack and are located substantially at the left and right sides of the server rack respectively. Multiple horizontal busses, that are parallel to each other, are coupled between the two vertical busses. Each horizontal bus is coupled to two PSUs and to one or more servers. The server rack as a whole can be oriented in a device, system or room vertically, horizontally or at an angle.

BRIEF DESCRIPTION OF THE DRAWINGS

Numerous aspects, implementations, objects and advantages of the present invention will be apparent upon consideration of the following detailed description, taken in conjunction with the accompanying drawings, in which like reference characters refer to like parts throughout, and in which.

DETAILED DESCRIPTION

Figure 1:
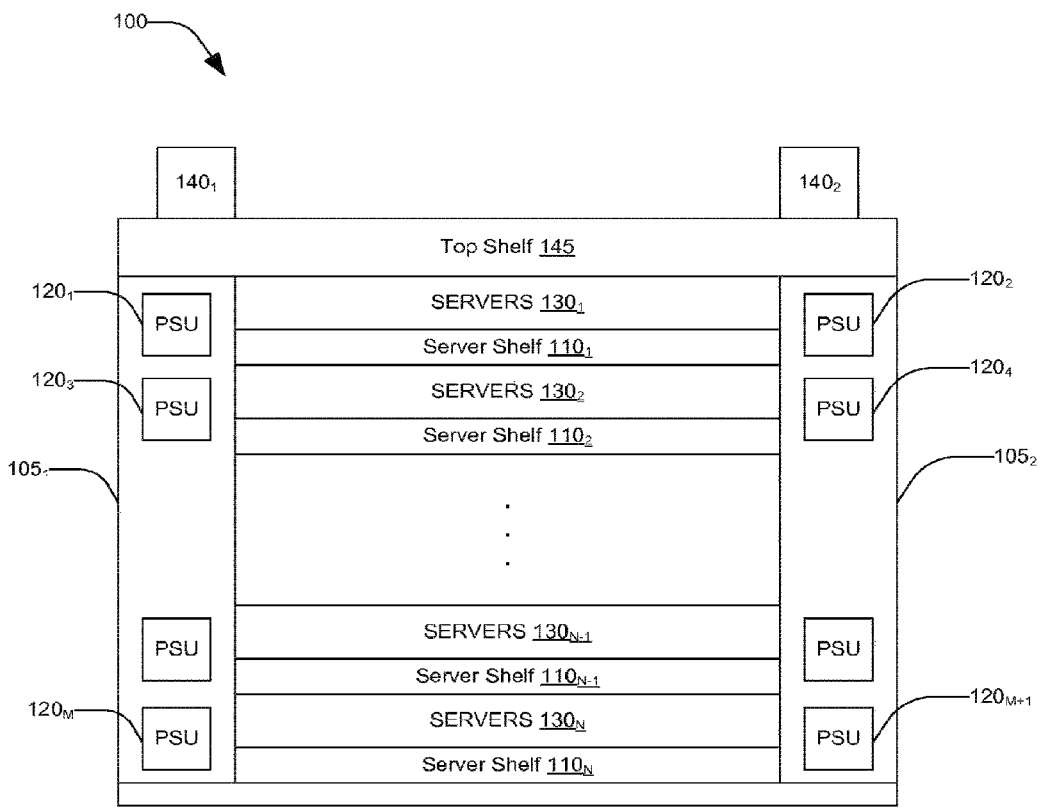
FIG. 1 illustrates a front view of a server rack, according to an implementation of the subject disclosure.

Implementations of the subject disclosure are described below with references to the above drawings, wherein like reference numerals are used to refer to like elements throughout. In the following description, for purposes of explanation, numerous specific details are set forth in order to provide a thorough understanding of the subject disclosure. It is to be appreciated, however, that the subject disclosure can be practiced without these specific details. In other instances, well-known structures and devices are shown in block diagram form in order to facilitate describing the subject disclosure.

As discussed herein, the terms N, N+1 and N+M are used herein according to their ordinary meanings. Also, N, N+1 and N+M are used interchangeably herein. M can be 0 or 1 or another integer number. As discussed herein, components are coupled to one another securely, hinged or removably. Secure and hinged are used with their usual meanings. Removable coupling includes any fastening that provides lateral stability without being permanently fixed. For example, removably coupled components can be removed using a single tool, such as a screwdriver. In a nonlimiting implementation, removable coupling can include mere placement of a component on top of a shelf, whereby gravity and friction or physical objects such as other components provide lateral stability. In a nonlimiting implementation, removable coupling includes the use of a tray that slides. Other nonlimiting examples of secure or removable coupling include adhesives, screws, clips, clamps, interference fits and pins.

As discussed herein, hot swappable means the power supply units can be removed during continuous operation of the other components on the server rack. By having components that are removably coupled, the server rack architecture disclosed herein facilitates components being hot swappable. As discussed herein, a load is a device that uses electrical power or communications from the server rack and is electrically coupled to other components on the server rack. The terms server, load, and component as used herein, are interchangeable. In a nonlimiting implementation, a video monitor is the load. In a non-limiting implementation, multiple servers or loads are placed on each shelf in a server rack.

FIG. 1 illustrates an exemplary front view of a server rack 100. The server rack 100 includes two side posts ($105_1$ and $105_2$) which are vertically oriented and contain compartments for housing power supply units. A first shelf ($110_1$) is securely coupled to and located toward the upper ends of the posts ($105_1$ and $105_2$). The first shelf ($110_1$) can extend into the posts ($105_1$ and $105_2$) and create the compartments for housing the PSUs ($120_1$, $120_2$). A second shelf ($110_2$) is securely coupled to the posts ($105_1$ and $105_2$) and is generally located below the first shelf ($110_1$). It is to be understood that any number of shelves ($110_N$) can be coupled to the posts ($105_1$ and $105_2$) and located above or below other shelves ($110_1$, $110_2$, $110_N$) in the rack 100. Furthermore, it is to be understood that any type of secure coupling can be used to attach shelves ($110_1$, $110_2$, $110_N$) to posts ($105_1$ and $105_2$) in a way that fixes their location and provides structural rigidity to the server rack 100.

Servers ($130_1$, $130_2$, $130_N$) are placed on top of the shelves ($110_1$, $110_2$, $110_N$) respectively and generally placed at the center of their respective shelves, equidistant from the first and second sides. Each shelf ($110_1$, $110_2$ or $110_N$) can house one or more servers (e.g. $130_1$) of same or different form factors. The servers (e.g. $130_1$, $130_2$, $130_N$) can be removably coupled to the shelves ($110_1$, $110_2$, $110_N$). In nonlimiting implementations, a load (e.g. $130_1$ can also include any combination of appliances, data center components, server system components, communication components, AC components, DC components and electronic devices.

The power supply units (or modules) ($120_1$, $120_2$, $120_3$, $120_4$, $120_{M+1}$) include power converters and backup power sources. In an implementation, the power distribution units controllers (e.g. $140_1$ and $140_2$) provide an AC fuse function or circuit breaker function and are removably coupled to a power control shelf (145) of the server rack 100. Furthermore, removable coupling allows the PDUs ($140_1$ and $140_2$) to be hot swappable. In an implementation, the power control shelf (e.g. 145) is located above the first shelf ($110_1$). In an implementation, the PDUs ($140_1$ and $140_2$) provide the initial AC power input connection for the server rack 100. In an implementation, the PDUs ($140_1$ and $140_2$) are electrically coupled to the power supply modules ($120_1$, $120_2$, $120_3$, $120_4$, $120_{M+1}$). In an implementation, the power supply modules (e.g. $120_1$, $120_2$, $120_3$, $120_4$, $120_{M+1}$) convert AC input to DC output. In an implementation, power supply modules (e.g. $120_1$, $120_2$, $120_3$, $120_4$, $120_{M+1}$) are mounted separate and external to server rack 100.

In an implementation, power supply modules (e.g. $120_1$, $120_2$, $120_3$, $120_4$, $120_{M+1}$) are electronic assemblies of batteries coupled to power converters. In an implementation, the power supply modules (e.g. $120_1$, $120_2$, $120_3$, $120_4$, $120_{M+1}$) are removably coupled to the shelves (e.g. $110_1$, $110_2$, $110_N$). Removable coupling allows the power supply modules (e.g. $120_1$, $120_2$, $120_3$, $120_4$, $120_{M+1}$) to be hot swappable. Power supply modules (e.g. $120_1$, $120_2$, $120_3$, $120_4$, $120_N$, $120_{M+1}$) are electrically coupled to loads (e.g. $130_1$, $130_2$, $130_N$). Power supply modules (e.g. $120_1$, $120_2$, $120_3$, $120_4$, $120_M$, $120_{M+1}$) invert or transform AC or DC input into AC or DC output for use by the loads (e.g. $130_1$, $130_2$, $130_N$). The server rack 100 can be placed inside or attached to a system, device or room at various orientations including vertically, horizontally or at an angle.

Figure 2:
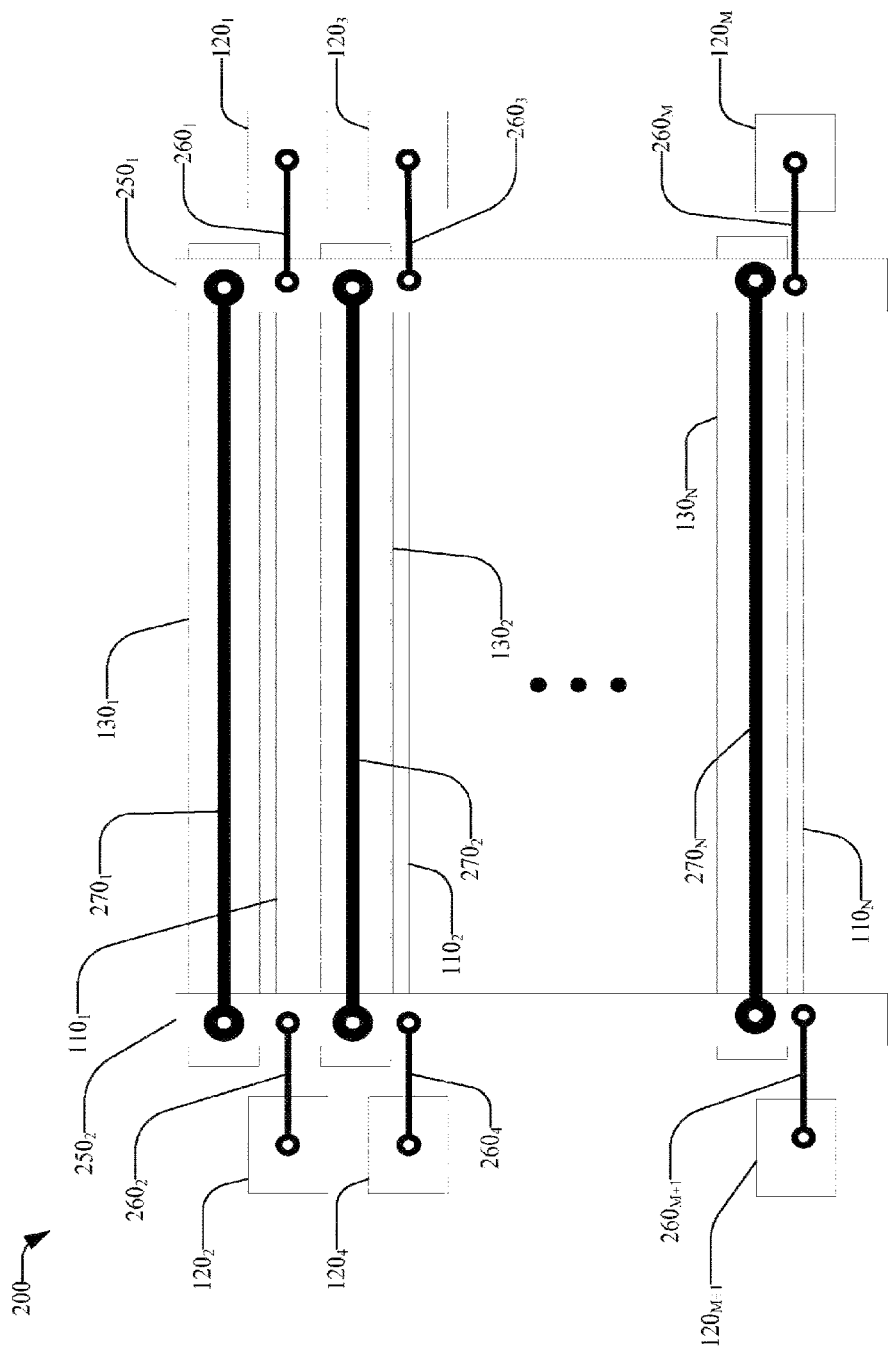
FIG. 2 illustrates a rear view of a server rack having vertical bus bars and horizontal busses.

FIG. 2 illustrates a rear view 200 of the power distribution components in an exemplary server rack. Viewed from the back side of the server rack 100, an array of electrical distribution busses (including e.g. $250_1$, $250_2$, $260_1$, $260_2$, $270_1$ and $270_N$) is securely coupled to the server rack 100. The power supply modules (e.g. $120_1$, $120_2$, $120_{M+1}$) are coupled to horizontal busses (e.g. $260_1$, $260_2$, $260_3$, $260_4$, $260_M$ and $260_{M+1}$) as shown. Busses ($260_1$, $260_2$, $260_3$, $260_4$, $260_M$ and $260_{M+1}$) are securely coupled to vertical bus bars ($250_1$, $250_2$) as shown. Vertical bus bars ($250_1$ and $250_2$) are also coupled to busses ($270_1$, $270_2$ and $270_N$) and to the servers ($130_1$, $130_2$, $130_N$). In an implementation, power cables are used in place of bus bars ($250_1$, $250_2$). In this disclosure, bus bars can be replaced with less rigid busses; for example, busses made of short lengths of cables having lugs and/or locations for forming bolted interconnections. As shown, power supply modules (e.g. $120_1$, $120_2$, $120_3$, $120_4$, $120_{M+1}$) are coupled to distribution busses (e.g. $260_1$, $260_2$, $260_3$, $260_4$, $260_{M+1}$).

The server rack architecture of FIG. 2 provides an uniform distribution of current along the various power distribution busses (including e.g. $250_1$, $250_2$). Uniform current distribution results from placing the power supply modules ($120_1$, $120_2$, $120_3$, $120_4$, $120_{M+1}$) near the loads (e.g. $130_1$, $130_2$, $130_N$). Lower current density results from supplying each load (e.g. $130_1$) with the current from one or two power supply modules (e.g. $120_1$ and $120_2$) through their respective busses (e.g. $250_1$, $250_2$, $260_1$, $260_2$ and $270_1$). As a result, the busses (including e.g. $250_1$, $250_2$, $260_1$, $260_2$ and $270_1$) can be a of smaller size to accommodate this uniform and lower distribution of current density. Conventional server rack designs have the current concentrated at the top or at the bottom of the server rack. As such, all of the current used by the loads in the rack flows through a single point, and is then distributed along the rack. Conventional architecture requires the bus to be sized for the largest current load. The subject disclosure allows for smaller bus sizes, which results in reduced material costs. Another benefit of using the server rack architecture shown in FIG. 2 is the improved isolation of component failures. For example, having multiple power supply modules (e.g. $120_1$, $120_2$, $120_3$, $120_4$, $120_M$, and $120_{M+1}$) and common connecting busses (e.g. $250_1$ and $250_2$) provide redundancy that prevents failure of the entire rack 100 upon failure of an individual component. This reduces the size of the effect of certain catastrophic failures on the rack. For example, if one power supply (e.g. $120_1$) was to fail, it would not cause the entire server rack to fail because the other power supplies (e.g. $120_3$, $120_M$) in the rack would remain in operation.

Figure 3:
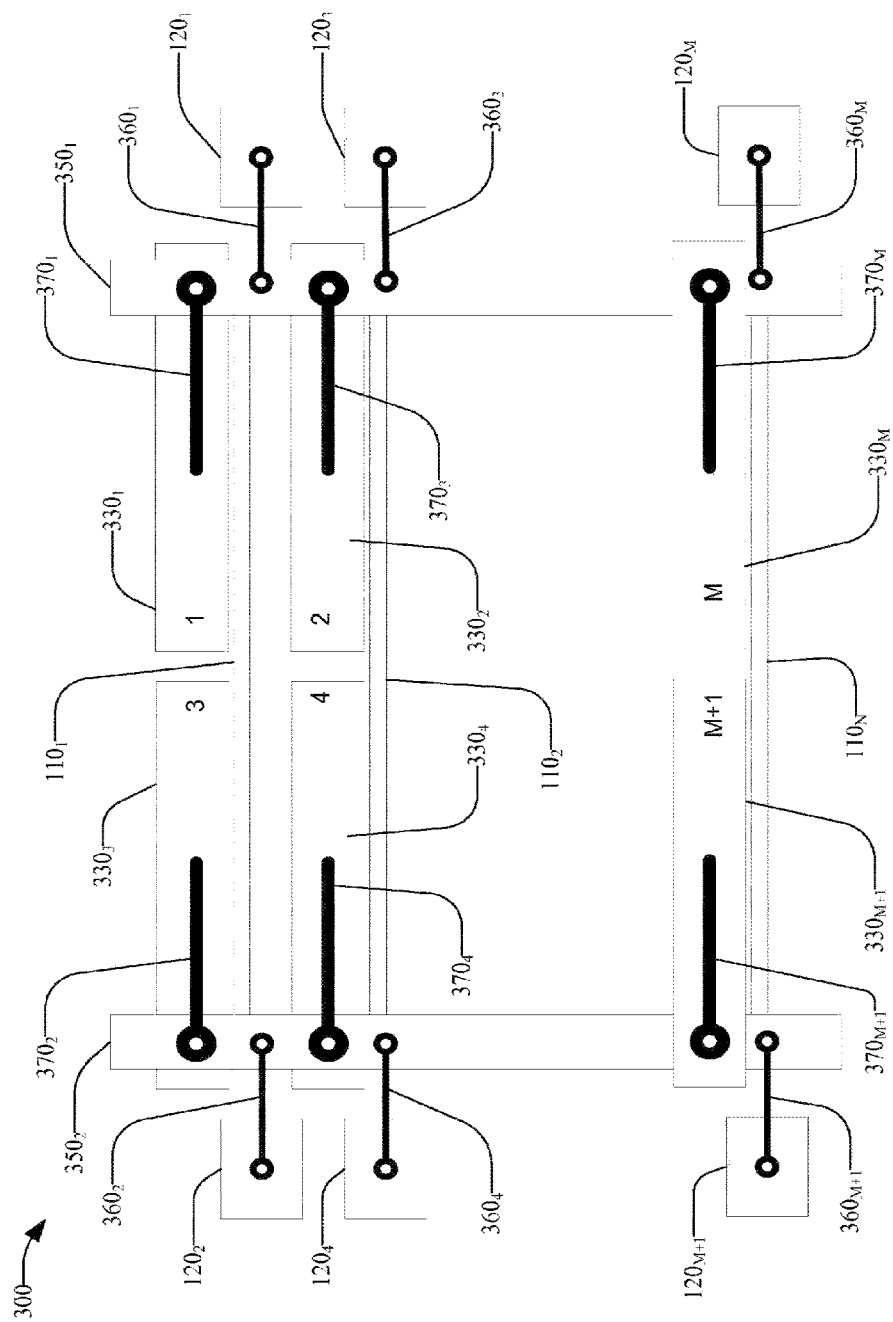
FIG. 3 illustrates a rear view of a server rack having divided horizontal busses.

FIG. 3 illustrates a rear view 300 of the power distribution components in an exemplary server rack having divided horizontal busses. As shown, the power supply modules (e.g. $120_1$, $120_2$, $120_3$, $120_4$, $120_{M+1}$, $120_{M+1}$) are coupled to busses (e.g. $360_1$, $360_2$, $360_3$, and $360_4$, $360_M$, $360_{M+1}$). Busses are coupled to the vertical bus bars $350_1$ and $350_2$ respectively. Vertical bus bar $350_1$ is coupled to busses $370_1$, $370_3$, $370_M$. Vertical bus bar $350_2$ is coupled to busses $370_2$, $370_4$, $370_{M+1}$. Busses $370_1$, $370_3$, $370_M$ are coupled to servers $330_1$, $330_3$, $330_N$ respectively. Busses $370_2$, $370_4$, $370_{M+1}$ are coupled to servers $330_2$, $330_4$, $330_{M+1}$ respectively. Two servers (e.g. $330_1$ and $330_2$) are placed on top of a shelf (e.g. $110_1$). Two servers (e.g. $330_3$ and $330_4$) are placed on top of another shelf (e.g. $110_2$). The servers (e.g. $330_1$ and $330_2$) are placed generally equidistant from the center of the rack 100 towards the left and right posts ($105_1$ and $105_2$). Each of the benefits of using the server rack architecture shown in FIG. 1 and FIG. 2 are common with the server architecture shown in FIG. 3. Furthermore, dividing the bus bars horizontally (e.g. $370_1$, $370_2$, $370_3$, and $370_4$, $370_M$, $330_{M+1}$) increases the isolation of failed load components.

Figure 4:
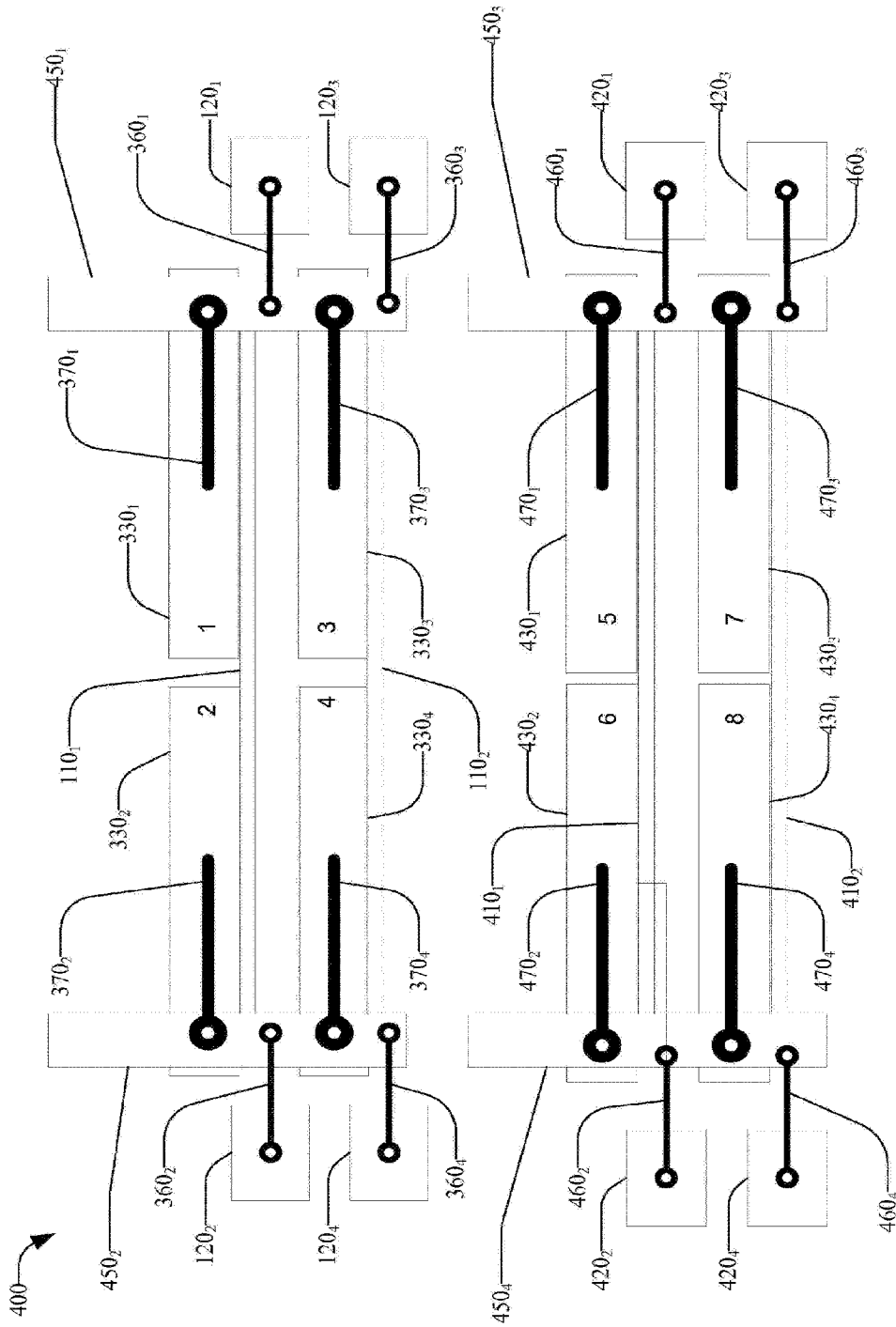
FIG. 4 illustrates a rear view of a server rack having divided vertical bus bars and divided horizontal busses.

FIG. 4 illustrates a rear view 400 of the power distribution components in an exemplary server rack having both vertically and horizontally divided busses. Vertical bus bars (e.g. $450_1$ and $450_2$) are located above vertical bus bars (e.g. $450_3$ and $450_4$) respectively. Eight (8) power supply modules ($120_1$, $120_2$, $120_3$, $120_4$ and $420_1$, $420_2$, $420_3$, $420_4$) are coupled to eight horizontal busses ($360_1$, $360_2$, $360_3$, $360_4$ and $460_1$, $460_2$, $460_3$, $460_4$) respectively. As shown, busses $360_1$, $360_2$, $360_3$, and $360_4$ are coupled to vertical bus bars $450_1$ and $450_2$. Also, as shown, busses $460_1$, $460_2$, $460_3$, $460_4$ are coupled to vertical bus bars $450_3$ and $450_4$. Vertical bus bars $450_1$ and $450_2$ are coupled to busses $370_1$, $370_2$, $370_3$, $370_4$. Vertical bus bars $450_3$ and $450_4$ are coupled to busses $470_1$, $470_2$, $470_3$, $470_4$. Busses $370_1$, $370_2$, $370_3$, $370_4$, are coupled to servers $330_1$, $330_2$, $330_3$, $330_4$. Busses $470_1$, $470_2$, $470_3$, $470_4$ are coupled to servers 4301, 4302, $430_3$, $430_4$. Each of the benefits of using the server rack architecture shown in FIG. 3 is common to the server architecture shown in FIG. 4. Furthermore, dividing the bus bars both horizontally and vertically further increases the isolation of failed load components.

Figure 5:
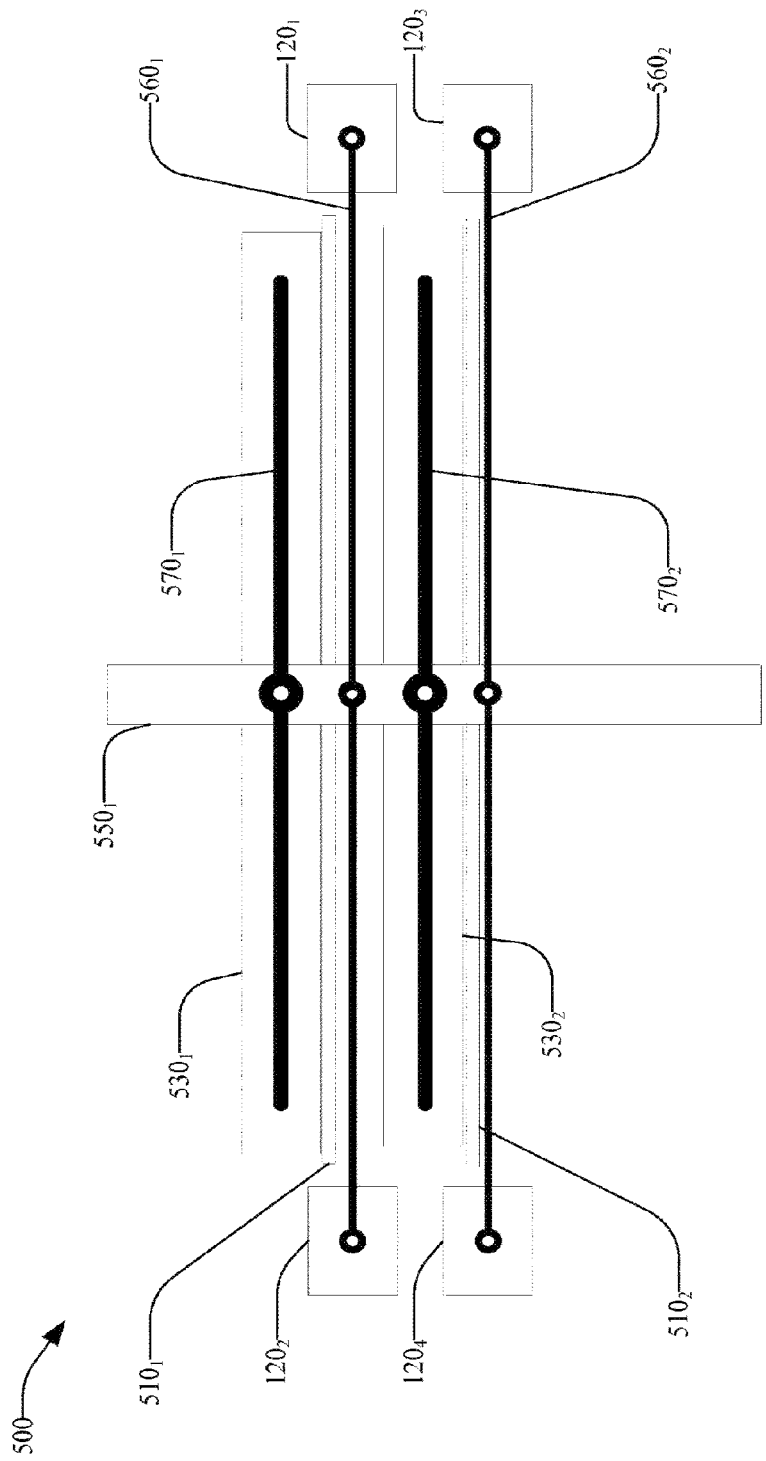
FIG. 5 illustrates a rear view of a server rack having a central vertical bus bar.

FIG. 5 illustrates a rear view 500 of an exemplary server rack having a central vertical power distribution bus. An array of electrical distribution busses (e.g. $550_1$, $560_1$, $560_2$, $570_1$, $570_2$) is securely coupled to the server rack 100 shown in FIG. 1 and is located at the rear side of the server rack. Two power supply modules $120_1$ and $120_2$ are coupled to the buss $560_1$. Two power supply modules $120_3$ and $120_4$ are coupled to the buss $560_2$. Busses (e.g. $560_1$, $560_2$) are coupled to vertical bus bar (e.g. $550_1$). A central vertical distribution bus (e.g. $550_1$) is generally located centered between the first and second sides. Vertical bus bar (e.g. $550_1$) is coupled to horizontal busses (e.g. $570_1$ and $570_2$). Bus $570_1$ is coupled to server $530_1$. Bus $570_2$ is coupled to server $530_2$. The two servers $530_1$ and $530_2$ are placed on top of the shelves $510_1$ and $510_2$ respectively. The servers are placed generally centered, equidistant from the first and second sides. Each of the benefits of using the server rack architecture shown in FIG. 2 is common with the server architecture shown in FIG. 5. However, the architecture shown in FIG. 5 utilizes less bus materials by having the single vertical bus.

Figure 6:
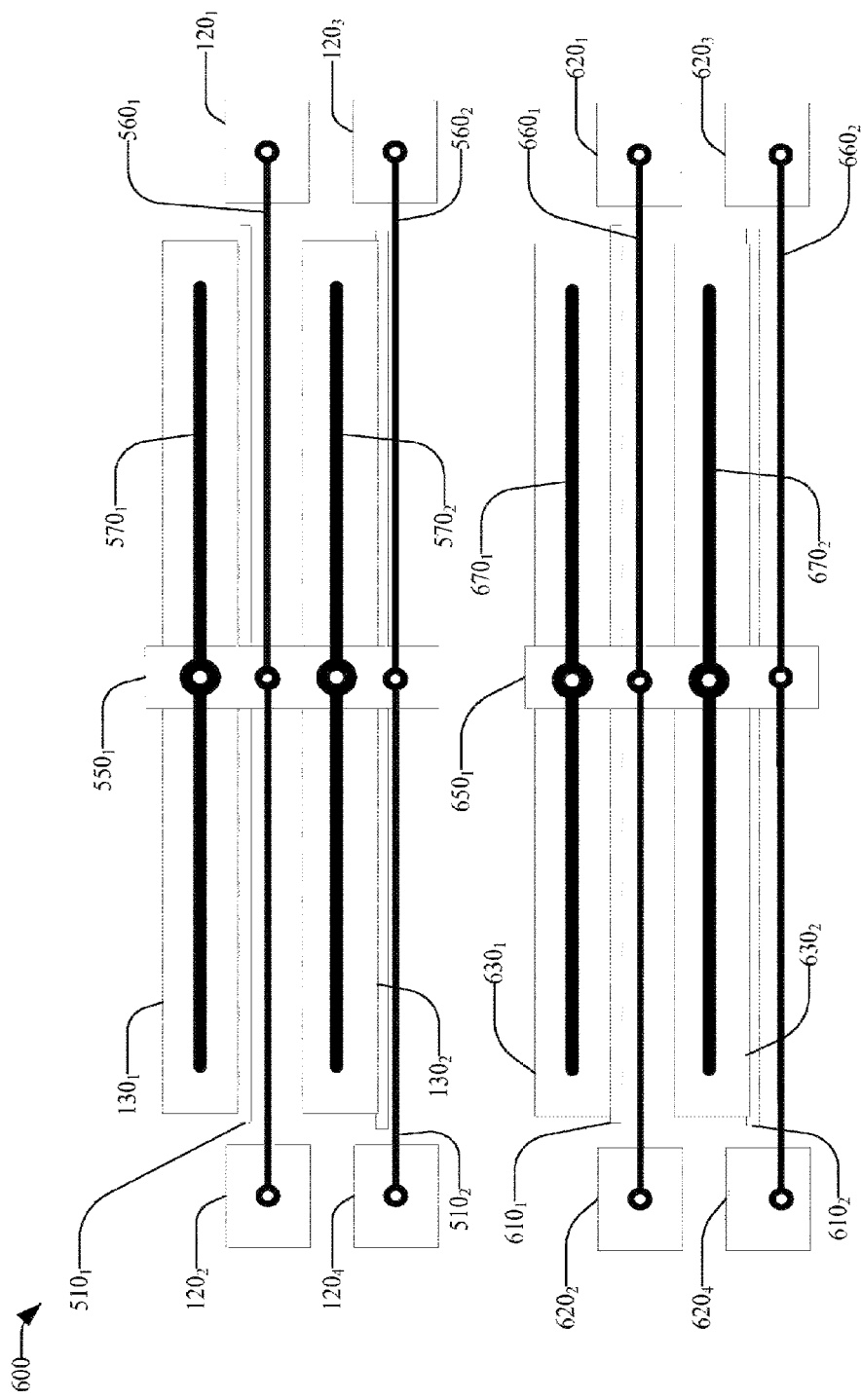
FIG. 6 illustrates a rear view of a server rack having a divided vertical bus bar.

FIG. 6 illustrates a rear view 600 of an exemplary server rack demonstrating architecture including multiple, central, vertical distribution busses (e.g. $550_1$, $650_2$). Viewed from the back side of the server rack 100, an array of electrical distribution busses (e.g. $550_1$, $650_2$, $560_1$, $560_2$, $570_1$, $570_2$, $660_1$, $660_2$, $670_1$, $670_2$) is securely coupled to the server rack 100 at the rear side of the server rack. Four (4) power supply modules $120_1$, $120_2$, $120_3$, $120_4$ are coupled to horizontal busses $560_1$, $560_2$. Four (4) power supply modules $620_1$, $620_2$, $620_3$, $620_4$ are coupled to horizontal busses $660_1$, $660_2$. Busses $560_1$, $560_2$ are coupled to vertical bus bar $550_1$. Busses $660_1$, $660_2$ are coupled to vertical bus bar $650_1$. Vertical bus bars ($550_1$, $650_1$) are generally located centered between the first and second sides. The first vertical bus bar ($550_1$) is located above second vertical bus bar (e.g. $650_2$). Vertical bus bars $650_1$, $650_2$ are also coupled to horizontal busses (e.g. $570_1$, $570_2$, $670_1$, $670_2$). Busses $570_1$, $570_2$, $670_1$, $670_2$ are coupled to servers (e.g. $130_1$, $130_2$, $630_1$, $630_2$). Four (4) servers (e.g. $130_1$, $130_2$, $630_1$, $630_2$) are placed on top of shelves (e.g. $510_1$, $510_2$, $610_1$, $610_2$). The servers are placed generally centered, equidistant from the first and second sides. Each of the benefits of using the server rack architecture shown in FIG. 5 is common with the server architecture shown in FIG. 6. Furthermore, the architecture shown in FIG. 6 provides for additional component isolation by dividing the vertical bus.

Figure 7:
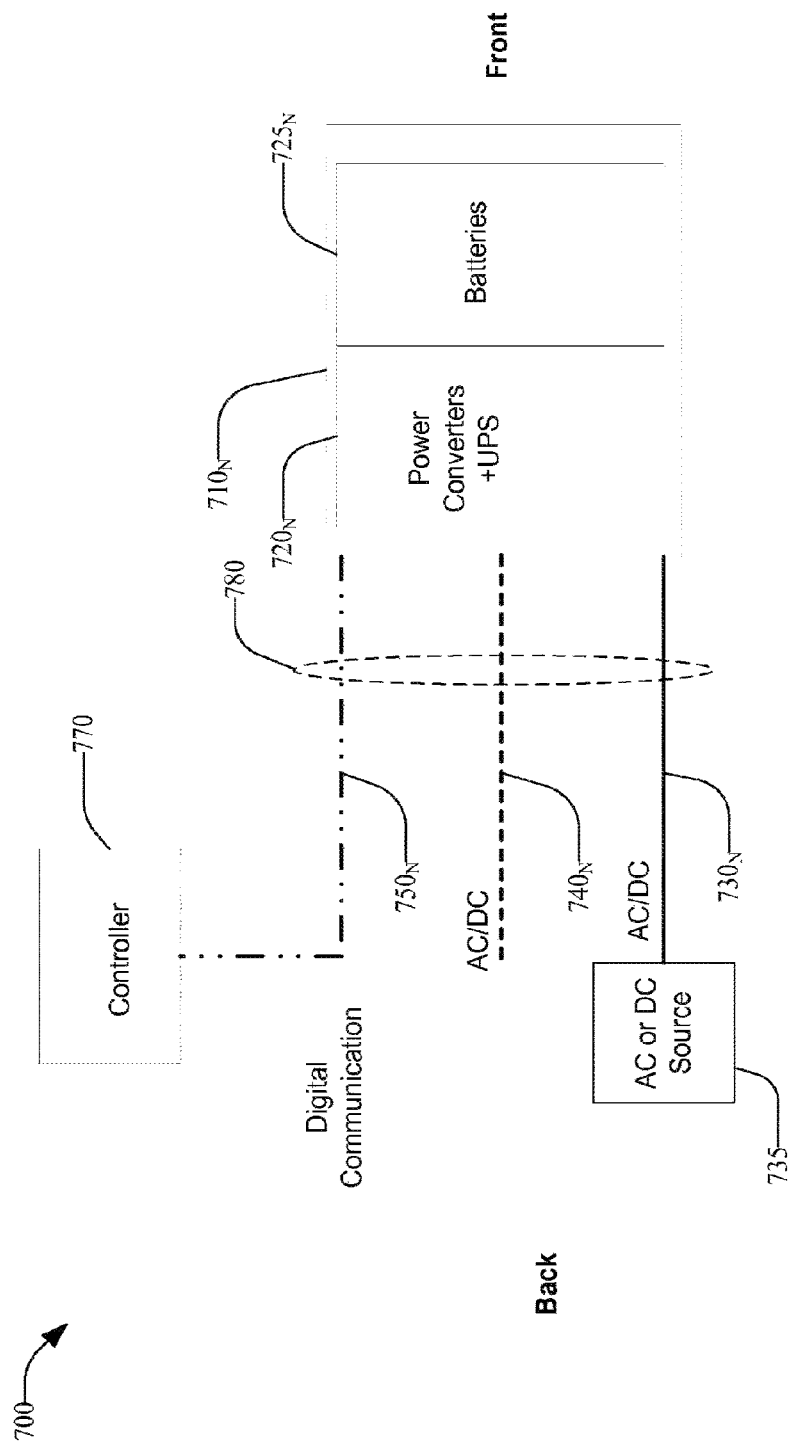
FIG. 7 illustrates an exemplary graphical representation of a battery power module for use in a server rack demonstrating architecture for enhanced power distribution.

FIG. 7 illustrates an exemplary graphical representation 700 of a power supply unit. In an implementation, each power supply module $710_N$ includes a battery $725_N$ (or another type of energy storage device that can be used as a backup power source) and a power converter with uninterruptible power supply $720_N$. Each battery $725_N$ is removably coupled to a power converter $720_N$. The battery $725_N$ is accessible from the front side of the server rack 100 and can be removed from the front side of the server rack 100. Removable coupling of the battery $725_N$ includes mechanical and electrical coupling.

In an implementation, the power supply module $710_N$ receives AC input from an AC source 735 through distribution lines $730_N$. The power supply module $710_N$ provides AC or DC output through distribution lines $740_N$. In another implementation, the power supply module $710_N$ receives DC input from a DC source 735 through distribution lines $730_N$. The power supply module $710_N$ provides AC or DC output through distribution lines $740_N$. Output distribution lines $740_N$ include busses and bus bars. Furthermore, each power supply module $710_N$ sends and receives digital communication through communication lines $750_N$ from a controller 770. In various implementations power inputs and outputs are all AC, or all DC, or a combination thereof. It is to be understood that any combination of electrical inputs and outputs can be used with the server rack architecture 100 and with the power supply modules outlined herein. The power lines $730_N$ and $740_N$ and the communication lines $750_N$ can be implemented by using a power strip 780. The power strip 780 can be vertically secured to the back of the server 100. The power strip 780 distributes both AC and DC power and also facilitates communication between the host 770 and the PSUs (e.g. $710_N$).

One of the benefits of the power supply module shown in FIG. 7 is improved serviceability. By locating the battery $725_N$ in front of the power converter $720_N$, the battery $725_N$ is made more accessible from the front of the server rack 100. By having a removable connector between the battery $725_N$ and the power converter $720_N$, the battery $725_N$ can be hot swapped. By having the AC $730_N$, DC $740_N$ and digital communication lines connected to the power supply module $710_N$ from the back side of the server 100, the serviceability of the module $710_N$ is made easier. Furthermore, having the AC $730_N$, DC $740_N$ and digital communication lines coupled to the power supply module $710_N$ from the back side of the rack 100 facilitates the use of the bus components and server rack architecture described herein.

Figure 8:
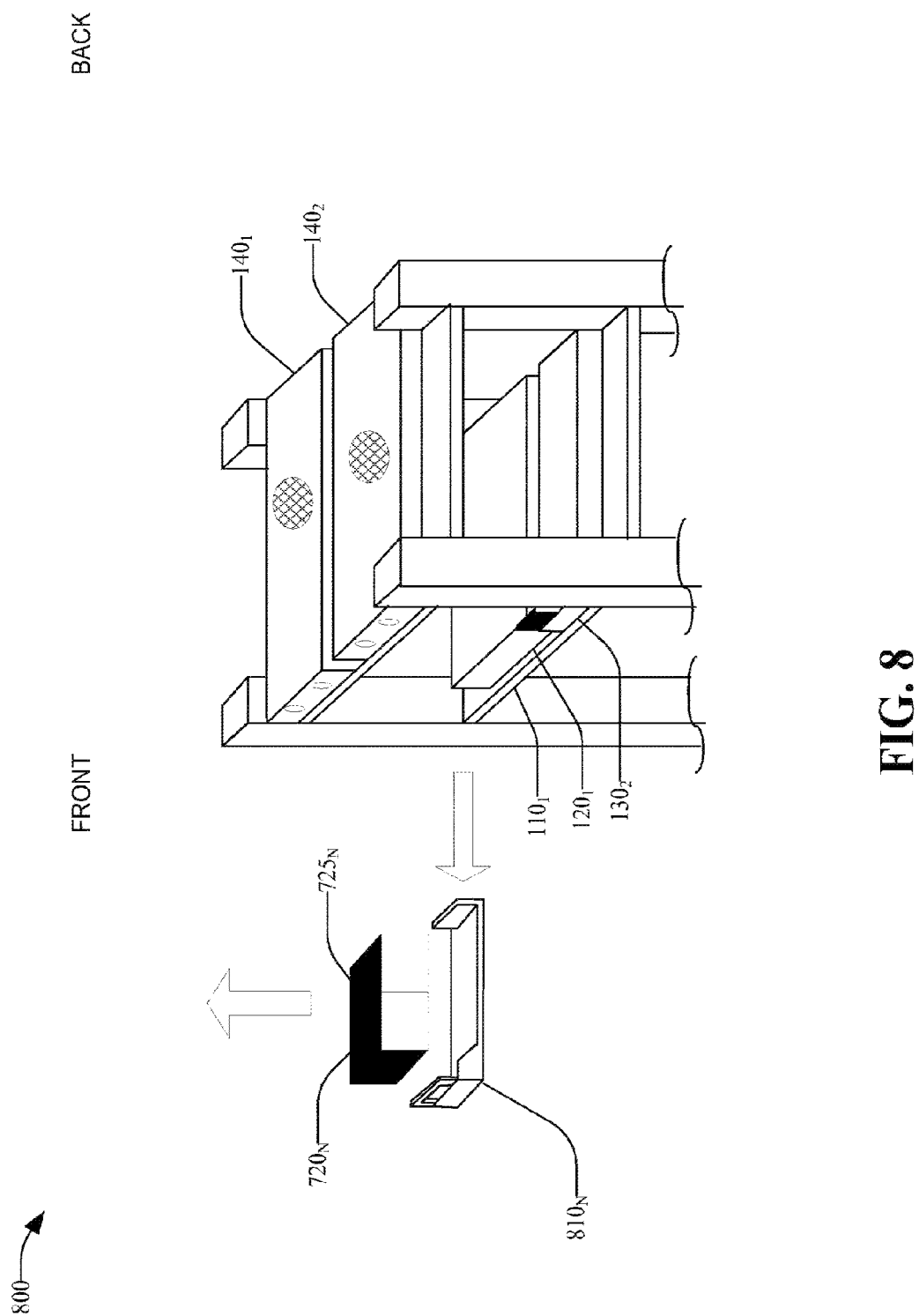
FIG. 8 illustrates an exemplary isometric graphical representation of a battery power module and a server rack.

FIG. 8 illustrates an exemplary isometric graphical representation 800 of a PSU tray and a server rack. In an implementation, the PSU tray $810_N$ includes four vertically oriented sides and a bottom. Each of the four vertical sides is coupled to one another at two edges. Each of the four vertical sides is coupled to the edges of the bottom. In nonlimiting implementations, the sides and bottom can be coupled permanently, removably, or hinged as mentioned in this description. The walls and bottom can be of rigid or flexible materials. The walls can be of any shape. In one implementation, the vertical walls are shaped with cutouts to accommodate manipulation of the power supply module. In an implementation, the tray $810_N$ includes details that allow users to grasp the tray from the front of the server rack 100 and remove the tray and a power supply module (e.g. $120_1$).

Nonlimiting examples of these details are handles, knobs or hooks. The details can be mounted to the top, front, first side or second side of the trays. In an implementation, a side is located at the rear of the tray. This rear side may be of any height. In an implementation, removable coupling of the batteries includes the use of a tray $810_N$ having interior dimensions such that a power converter 720 and a battery 725 would fit with minimal clearance and be mechanically retained by any two opposing sides of the tray. It is to be understood that the battery 725 is only one type of backup power source that can be used. Other types of energy storage devices can be used as backup power sources.

Figure 9:
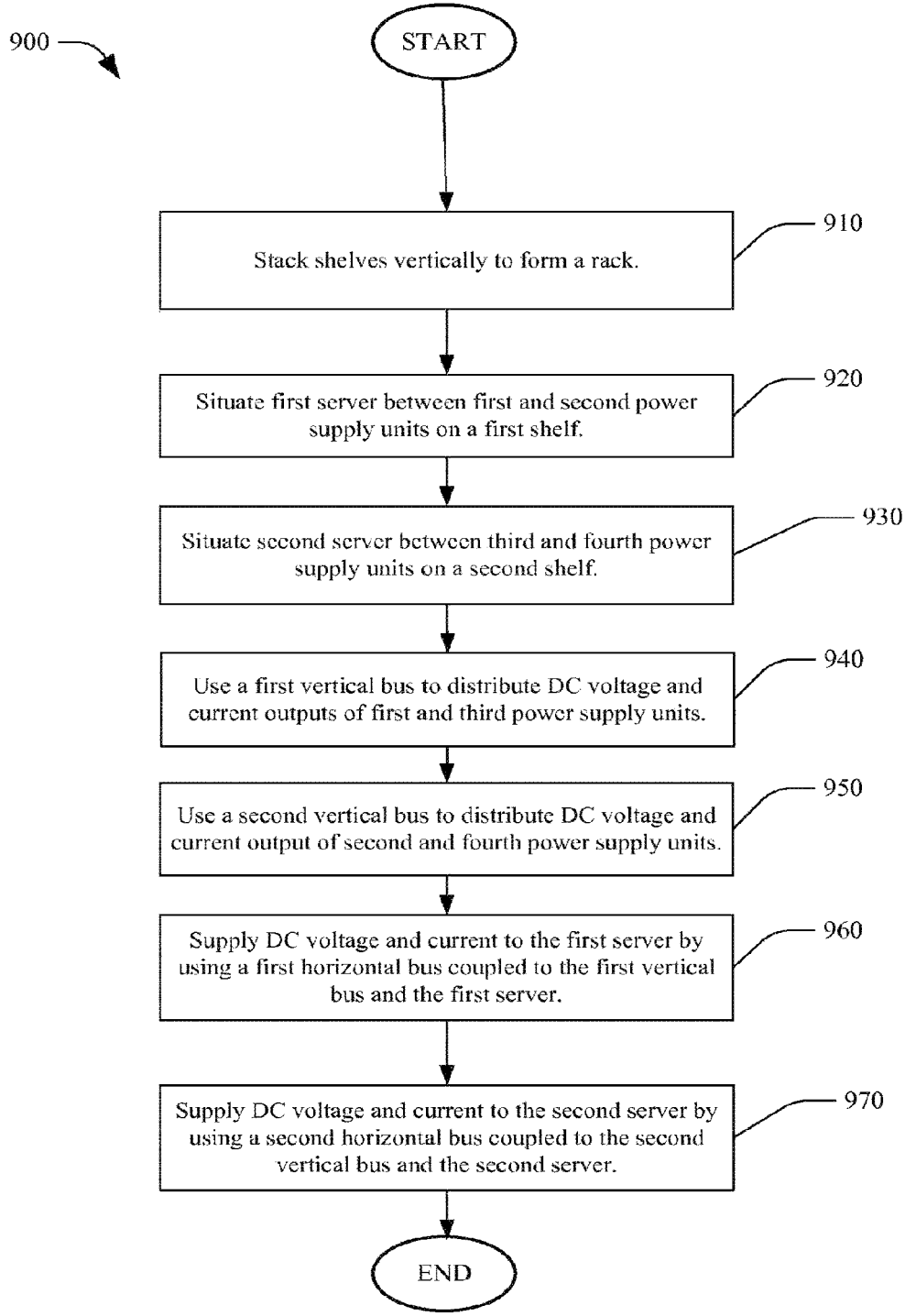
FIG. 9 illustrates a flow diagram of an exemplary method for assembling an efficient server rack.

FIG. 9 illustrates a flow diagram of an exemplary method for assembling a server rack. According to the methodology shown in the flow diagram 900, at 910, shelves (such as $110_1$, $110_2$, and $110_N$ as shown in FIG. 1) are stacked vertically to form the rack. At 920, a first server (such as $130_1$ as shown in FIG. 1) is located between the first and second power supply modules (such as $120_1$ and $120_2$ as shown in FIG. 1) on a first shelf (such as $110_1$ as shown in FIG. 1). At 930, a second server (such as $130_2$ as shown in FIG. 1) is located between the third and fourth power supply modules (such as $120_3$, $120_4$ as shown in FIG. 1) on a second shelf (such as $110_2$ as shown in FIG. 1).

At 940, a first bus bar (such as vertical bus $250_1$ as shown in FIG. 2) is connected to first and third power supply modules (such as $120_1$ and $120_3$ as shown in FIG. 2). At 950, a second bus bar (such as vertical bus $250_2$ as shown in FIG. 2) is connected to second and fourth power supply modules (such as $120_2$ and $120_4$ as shown in FIG. 2). At 960, the first bus bar (such as vertical bus $250_1$ as shown in FIG. 2) is connected to a first server (such as $130_1$ as shown in FIG. 2) to supply voltage and current to the first server. At 970, the second bus (such as vertical bus $250_2$) is coupled to a second server (such as $130_2$ as shown in FIG. 2) to supply voltage and current to the second server.

A benefit of using the method of server rack assembly 900 is the resulting more uniform distribution of lower current density along the various power distribution busses (such as $250_1$, $260_M$ and $270_M$ shown in FIG. 2). Uniform current distribution results from placing the power supply modules (such as $120_N$ shown in FIG. 2) near the loads e.g. $130_N$ shown in FIG. 1). Lower current results from supplying each load (such as $130_N$ shown in FIG. 2) with the current from one or two power supply modules (such as $120_N$ shown in FIG. 2) through their respective busses (such as $250_1$, $250_2$, $260_{N+1}$ and $270_M$ shown in FIG. 2). Busses (such as $250_1$, $260_M$ and $270_N$ shown in FIG. 2) can be a smaller size and adequately accommodate this uniform distribution of lower current density. Another benefit of using the method of assembling server rack architecture shown in FIG. 9 is the improved accessibility to the power supply modules (e.g. $120_{1\ thru\ M+1}$ shown in FIG. 2). Being located to the first and second sides and distributed vertically, the power supply modules ($120_{1\ thru\ M+1}$) are accessible from the front side of the server rack 100 shown in FIG. 1. Another benefit of the method of assembling a server rack shown in FIG. 9 is that multiple power supply modules (e.g. $120_{1,2,3}$ shown in FIG. 2) are attached to the common bus bars $250_1$ and $250_2$.and the servers (e.g. $130_N$) shown in FIG. 2. This provides for a redundancy of power. It is to be understood that the rack can be placed or positioned inside a computer system, a device or a server room vertically, horizontally or at an angle. It is to be understood that if the rack is positioned horizontally or at an angle, the devices on the rack must be secured to the shelves such that they don't slide or fall off the rack because of gravity. It is also to be understood that the various shelves and busses of the server rack can be positioned at different angles.

Figure 10:
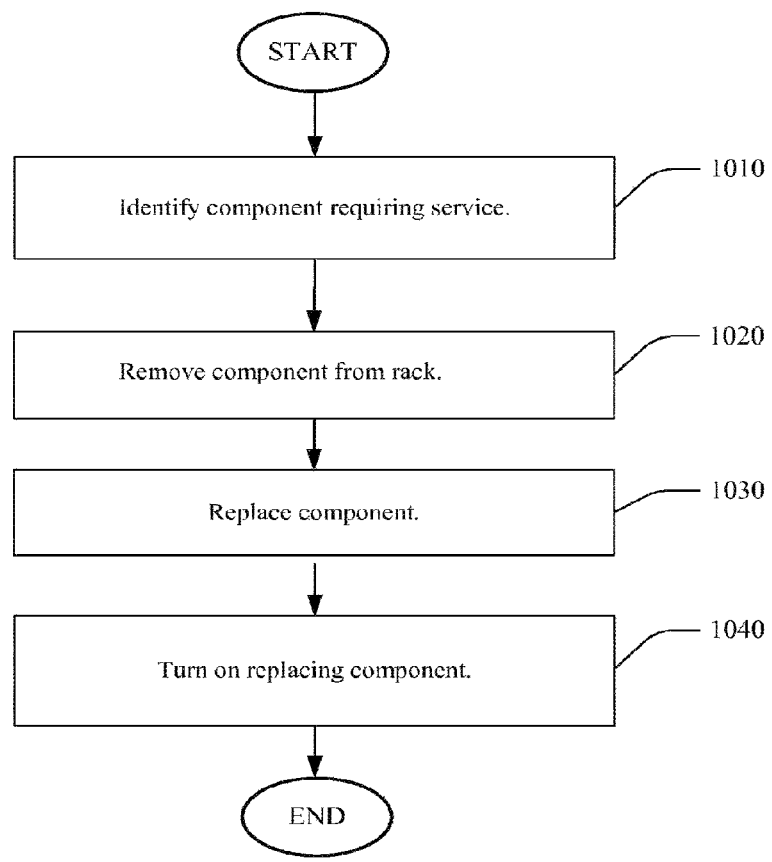
FIG. 10 illustrates an example methodology for hot swapping a server rack component.

FIG. 10 illustrates an example methodology for hot swapping a server rack component. According to the construction methodology flow diagram 1000, at 1010, a component requiring service is identified. Service as used herein can include, for example, repair, replacement or inspection. At 1020, the component requiring service is removed from the rack. To that end, the component requiring service is turned off and no other components in the rack are turned off. Turning off includes, for example, pushing buttons or sending control signals that deactivate the operations of the component. The primary advantage of hot swapping is that a component is removed and replaced from a system of components without affecting the operation of the other components. The server rack system 100 as discussed herein facilitates hot swapping PDUs (e.g. $140_1$ shown in FIG. 1) power supply modules (e.g. $120_N$ shown in FIG. 1) and servers (e.g. $130_N$ shown in FIG. 1). It is to be understood that other components can be added to the server rack 100 and can be hot swappable. The component requiring service is also mechanically disconnected from the rack. Mechanical disconnection includes the disassembly of any of the mechanical couplings discussed herein. Prior to or after mechanically disconnecting the component, the component requiring service is electrically disconnected from the rack. Electrical disconnection includes disassembly of any of the electrical couplings discussed herein. At 1030, a new, repaired or replacing component is electrically, mechanically and/or programmatically connected to the rack. Mechanical reconnection includes returning the component to its shelf, tray or otherwise placed into the rack. At 1040, the component is turned on and its operation commences.

Figure 11:
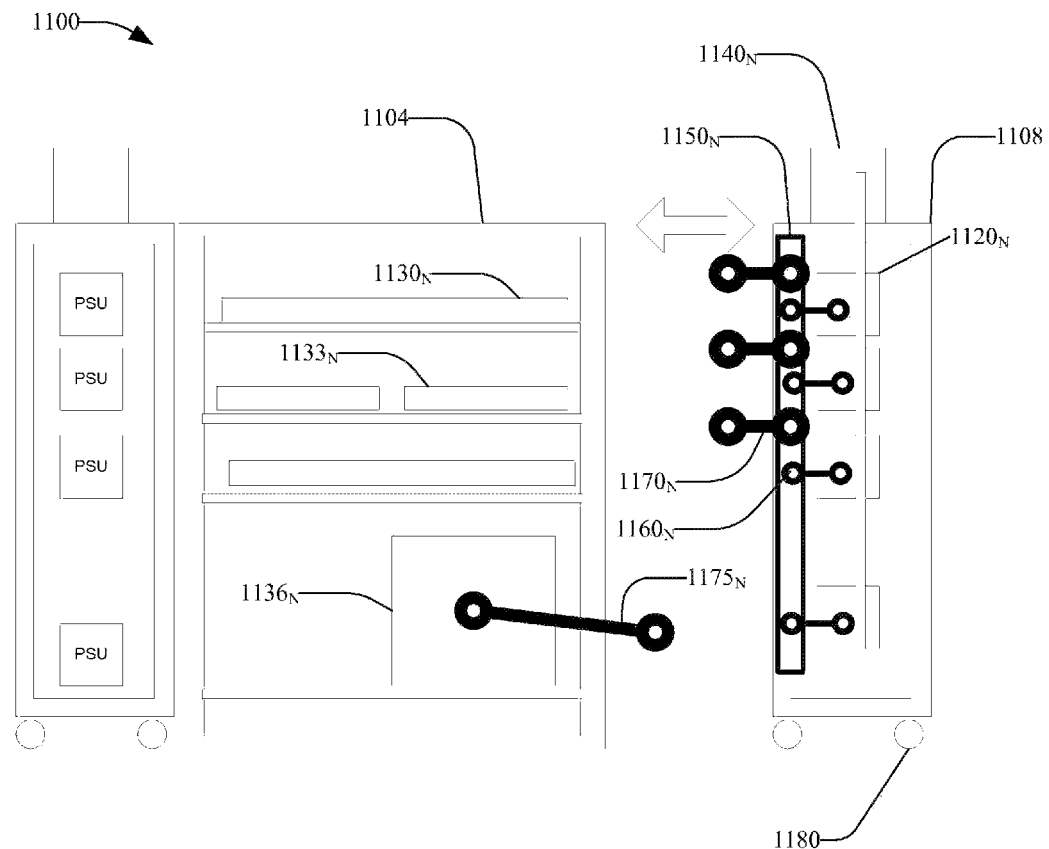
FIG. 11 illustrates an exemplary graphical representation of a server rack including separable racks for housing PSUs.

FIG. 11 illustrates an exemplary graphical representation 1100 of a server rack with removable PSUs racks. A server component rack 1104 is supported by four corner posts or two sides, vertically oriented to define four sides including a front, a back and two additional sides. The server component rack 1104 houses and physically supports load components (e.g. $1130_N$, $1133_N$ and $1136_N$). A PSUs rack 1108 is also shown that houses and physically supports PSUs and related components (e.g. $1140_N$ (e.g. a PDU), $1150_N$ (e.g. a bus) $1120_N$, (e.g. a PSU)). Additionally, the PSUs rack (or power components rack) 1108 has multiple wheels or casters 1180. The wheels 1180 facilitate the movement of the power component rack 1108 independently of server component rack 1104.

The PDU $1140_N$ receives external AC (or DC) voltage and current, and controls the flow of the input current (e.g. by using fuses or circuit breakers). Power control modules $1140_N$ are connected to power supply modules $1120_N$. Bus bars $1160_N$ are coupled to power supply modules $1120_N$ and vertical bus bars $1150_N$. Bus bars $1170_N$ are coupled to vertical bus bar $1150_N$ and loads (e.g. $1130_N$, $1133_N$ and $1136_N$). In an implementation, bus bars $1170_N$ are securely coupled to vertical bus bars $1150_N$ and removably coupled to the loads (e.g. $1130_N$, $1133_N$ and $1136_N$) such that bus bars $1170_N$ generally travel as parts of the power component rack 1108. In an implementation, bus bars $1175_N$ are securely coupled to the loads (e.g. $1130_N$, $1133_N$ and $1136_N$) and removably coupled to the vertical bus bars $1150_N$ such that the bus bars $1175_N$ generally travel with the loads.

The advantages of the implementation of the server rack 1104 and separate power rack 1108 assembly 1100 (assembly) are common with those outlined herein for various implementations. One additional advantage of the assembly 1100 is the mobility of power component racks 1108. For example, when loads on a server rack 1104 require low current, only one power component rack 1108 may be necessary. The additional power component rack 1108 can be disconnected mechanically and electrically from the server component rack 1104 in a first location, and moved to a second location. Such mobility can free space in the first location. Another advantage of such mobility is the opportunity for servicing the battery rack in the second location.

What has been described above includes examples of the implementations. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated implementations of the subject disclosure, including what is described in the Abstract, is not intended to be exhaustive or to limit the disclosed implementations to the precise forms disclosed. While specific implementations and examples are described herein for illustrative purposes, various modifications are possible that are considered within the scope of such implementations and examples, as those skilled in the relevant art can recognize.

What is claimed is:

1. A server rack, comprising:
   vertically stacked first and second shelves, wherein the first shelf is located above the second shelf;
   a vertical bus secured to the back side of the server rack, located substantially at the center of the server rack, and configured to distribute power to a plurality of sets of power supply units, each set of power supply units located next to and associated with a corresponding shelf in the server rack;
   a first horizontal bus conductively coupled to the vertical bus at approximately its center and conductively coupled to a first set of power supply units; and
   a second horizontal bus conductively coupled to the vertical bus at approximately its center and conductively coupled to a server located on the first shelf and equidistant from first and second sides of the server rack;
   wherein the first set of power supply units comprises at least two power supply units that are separated and located on left and right sides of the server and each distribute power to the server through the vertical bus and the first and second horizontal buses.

2. The server rack of claim 1, wherein the vertical bus is a first vertical bus, the server rack further comprising:
   a second vertical bus coupled to the back side of the server rack and situated below the first vertical bus.

3. The server rack of claim 2, wherein there is an open space between the ends of the first vertical bus and the second vertical bus that are closest to each other.

4. The server rack of claim 1, wherein the server is a first server, and wherein the first set of power supply units powers both the first server and a second server and a second set of power supply units powers both the first and the second servers.

5. The server rack of claim 1, wherein each power supply unit is hot swappable without interrupting the operations of a corresponding server.

6. The server rack of claim 1, further comprising:
   a third horizontal bus conductively coupled to the vertical bus at approximately its center and conductively coupled to a second set of power supply units; and
   a fourth horizontal bus conductively coupled to the vertical bus at approximately its center and conductively coupled to a second server located on the second shelf and equidistant from first and second sides of the server rack,
   wherein the second set of power supply units comprises of at least two power supply units that are separated and located on left and right sides of the second server and each distribute power to the server through the vertical bus and the first and second horizontal buses.

7. The server rack of claim 1, wherein the distribution of power to the server through the vertical bus and the first and second horizontal buses is configured to provide a uniform distribution of reduced current density.

8. A server rack, comprising:
   vertically stacked first and second shelves, wherein the first shelf is located above the second shelf;
   a central vertical bus coupled to a back side of the server rack, and configured to distribute power to a plurality of sets of power supplies, each set of power supplies located adjacent to and associated with a corresponding shelf in the server rack;
   a first set of multiple horizontal buses that connect the central vertical bus to a set of multiple servers, wherein each horizontal bus in the first set of multiple horizontal buses respectively couples the central vertical bus to a respective server from the set of multiple servers; and
   a second set of multiple horizontal buses that connect the central vertical bus to a first and second set of power supplies, wherein the first and second set of power supplies provide power to the set of multiple servers;
   wherein the first set of power supplies comprises at least two power supply units that are separated and located on left and right sides of the set of multiple servers and each power supply unit distributes power to the set of multiple servers through the central vertical bus and the first and second set of horizontal buses.

9. The server rack of claim 8, wherein the first and the second set of multiple horizontal buses are located at approximately a same height from a bottom of the server rack, and wherein there is an open space between ends of the first and second horizontal busses that are located towards a center of the server rack.

10. The server rack of claim 8, wherein a horizontal bus of the first set of multiple horizontal buses couples a first and second power supply unit to the central vertical bus.

11. The server rack of claim 8, wherein a horizontal bus of the second set of multiple horizontal buses couples a third and fourth power supply unit to the central vertical bus.

12. The server rack of claim 8, further comprising:
   a second central vertical bus coupled to a back side of the server rack;
   a third set of multiple horizontal buses that connect the second central vertical bus to a second set of multiple servers, wherein each horizontal bus in the third set of multiple horizontal buses respectively couples the second central vertical bus to a respective server from the second set of multiple servers; and
   a fourth set of multiple horizontal buses that connect the second central vertical bus to a third and fourth set of multiple power supplies, and wherein the third and fourth set of multiple power supplies provide power to the second set of multiple servers.

13. The server rack of claim 8, wherein the distribution of power to the set of multiple servers through the central vertical bus and the first and second set of horizontal buses is configured to provide a uniform distribution of reduced current density.

\* \* \* \* \*